(12) United States Patent
Matsuda

(10) Patent No.: US 11,564,313 B2
(45) Date of Patent: Jan. 24, 2023

(54) WIRING BODY AND METHOD FOR MANUFACTURING SAME

(71) Applicant: NIPPON MEKTRON, LTD., Tokyo (JP)

(72) Inventor: Fumihiko Matsuda, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 10 days.

(21) Appl. No.: 17/321,605

(22) Filed: May 17, 2021

(65) Prior Publication Data

US 2022/0053636 A1    Feb. 17, 2022

(30) Foreign Application Priority Data

Aug. 11, 2020 (JP) .............................. JP2020-135927

(51) Int. Cl.
*H05K 1/02* (2006.01)
*H05K 1/11* (2006.01)
(Continued)

(52) U.S. Cl.
CPC ........... *H05K 1/0298* (2013.01); *H05K 1/116* (2013.01); *H05K 3/02* (2013.01); *H05K 3/4602* (2013.01);
(Continued)

(58) Field of Classification Search
CPC ........ H05K 1/0298; H05K 1/116; H05K 3/02; H05K 3/4602; H05K 3/4673;
(Continued)

(56) References Cited

U.S. PATENT DOCUMENTS 4,904,968 A * 2/1990 Theus .................. H05K 1/0218
174/250
7,726,016 B2    6/2010 Ohsumi et al.
(Continued)

FOREIGN PATENT DOCUMENTS

JP    H11-220263 A    8/1999
JP    2002-232143 A    8/2002
(Continued)

OTHER PUBLICATIONS

An Office Action; "Notice of Reasons for Refusal," mailed by the Japanese Patent Office dated Apr. 5, 2022, which corresponds to Japanese Patent Application No. 2020-135927 and is related to U.S. Appl. No. 17/321,605 with English language translation.
(Continued)

*Primary Examiner* — Steven T Sawyer
(74) *Attorney, Agent, or Firm* — Studebaker & Brackett PC

(57) ABSTRACT

A wiring body includes: a core insulating base material having a first main surface and a second main surface; a signal line and a first power supply line provided on the first main surface; a second power supply line provided on the second main surface and electrically connected to the first power supply line; a first dielectric layer laminated on the first main surface so as to embed the signal line and the first power supply line; a first ground layer provided on the first dielectric layer; a second dielectric layer laminated on the second main surface so as to embed the second power supply line; and a second ground layer provided on the second dielectric layer and sandwiching at least the signal line together with the first ground layer.

15 Claims, 9 Drawing Sheets

(51) Int. Cl.
*H05K 3/02* (2006.01)
*H05K 3/46* (2006.01)

(52) U.S. Cl.
CPC ... *H05K 3/4673* (2013.01); *H05K 2201/0141* (2013.01); *H05K 2201/09563* (2013.01); *H05K 2203/061* (2013.01); *H05K 2203/107* (2013.01)

(58) Field of Classification Search
CPC . H05K 2201/0141; H05K 2201/09563; H05K 2203/061; H05K 2203/107; H05K 3/4614; H05K 2201/0715; H05K 2201/09336; H05K 2201/09672; H05K 2201/09736; H05K 1/0219; H05K 3/427; H05K 3/4611; H05K 3/4638; H05K 1/0224; H05K 1/0227; H05K 2201/093; H05K 2201/09327
See application file for complete search history.

(56) References Cited

U.S. PATENT DOCUMENTS

| | | | |
|---|---|---|---|
| 7,834,277 B2 | 11/2010 | Ohsumi et al. | |
| 8,501,299 B2 | 8/2013 | Ikeda et al. | |
| 9,807,870 B2 | 10/2017 | Komatsu | |
| 10,736,208 B2 | 8/2020 | Takano et al. | |
| 11,152,695 B2 | 10/2021 | Takayama et al. | |
| 2004/0222015 A1 | 11/2004 | Ohsumi et al. | |
| 2008/0093726 A1* | 4/2008 | Preda | H01L 23/50 257/700 |
| 2008/0257597 A1* | 10/2008 | Ohsumi | H05K 3/427 174/266 |
| 2009/0011201 A1 | 1/2009 | Ikeda et al. | |
| 2010/0006334 A1* | 1/2010 | Takenaka | H05K 3/465 174/262 |
| 2013/0057365 A1* | 3/2013 | Mizushima | H01P 5/028 333/238 |
| 2014/0104798 A1* | 4/2014 | Park | H05K 3/4673 361/764 |
| 2015/0351222 A1 | 12/2015 | Baba et al. | |
| 2017/0048968 A1* | 2/2017 | Komatsu | H01P 11/003 |
| 2017/0278781 A1* | 9/2017 | Taguchi | H01L 23/50 |
| 2017/0367197 A1* | 12/2017 | Takano | H05K 3/06 |
| 2020/0015351 A1 | 1/2020 | Takano et al. | |
| 2020/0084879 A1* | 3/2020 | Fukuchi | H05K 1/0243 |
| 2020/0373655 A1* | 11/2020 | Takayama | H01Q 1/40 |

FOREIGN PATENT DOCUMENTS

| | | |
|---|---|---|
| JP | 2004335704 A | 11/2004 |
| JP | 2009239184 A | 10/2009 |
| JP | 5658399 B1 | 1/2015 |
| JP | 2015-226035 A | 12/2015 |
| JP | 2019-106508 A | 6/2019 |
| JP | 2020-088318 A | 6/2020 |
| WO | 2007083811 A1 | 7/2007 |
| WO | 2014002785 A1 | 1/2014 |
| WO | 2014157031 A1 | 10/2014 |
| WO | 2020/031875 A1 | 2/2020 |

OTHER PUBLICATIONS

An Office Action mailed by the Japan Patent Office dated Jun. 24, 2022, which corresponds to Japanese Patent Application No. 2020-135927 and is related to U.S. Appl. No. 17/321,605; with English translation.

An Office Action; "Notice of Reasons for Refusal," mailed by the Japanese Patent Office dated Oct. 4, 2022, which corresponds to Japanese Patent Application No. 2020-135927 and is related to U.S. Appl. No. 17/321,605; with English language translation.

* cited by examiner

WIRING BODY AND METHOD FOR MANUFACTURING SAME

CROSS-REFERENCE TO RELATED APPLICATION

This application is based on Japanese Patent Application No. 2020-135927 filed with the Japan Patent Office on Aug. 11, 2020, the entire content of which is hereby incorporated by reference.

BACKGROUND

1. Technical Field

One aspect of the present disclosure relates to a wiring body and a method for manufacturing the wiring body.

2. Related Art

In recent years, in electronic devices such as smartphones, notebook computers, digital cameras, and game machines, an information processing amount has rapidly increased with progress of miniaturization and speeding up. Therefore, signal speeds tend to increase more and more. For mobile communication terminals such as smartphones, transition to a next-generation communication standard 5G has started in 2019. In the 5G, a frequency of a signal transmitted and received by the communication terminal ranges from several GHz to 20 to 30 GHz. Further, around 2022, a signal frequency is expected to increase to about 50 GHz. As the signal frequency increases, signal transmission loss increases. Therefore, it is required for the wiring body provided with a signal line (transmission line) to reduce the transmission loss.

Further, with the miniaturization and high density of the electronic devices, not only the signal line but also a power supply line (power line) may be provided in the wiring body. The power supply line is used to supply electric power, which is supplied from a power source of the electronic device, to an electronic component such as a processor. Specifically, in the case of mobile terminals such as smartphones, strict restrictions are imposed on a width dimension of the wiring body. On the other hand, as the speed of the electronic devices increases, power consumption increases, so that a larger power supply capacity is required.

WO 2014/002785 and WO 2014/157031 describe high-frequency signal lines used for transmitting high-frequency signals.

SUMMARY

A wiring body includes: a core insulating base material having a first main surface and a second main surface opposite to the first main surface; a signal line provided on the first main surface and extending in a longitudinal direction of the wiring body; a first power supply line provided on the first main surface and extending in the longitudinal direction of the wiring body; a second power supply line provided on the second main surface and extending in the longitudinal direction of the wiring body, and electrically connected to the first power supply line by an interlayer connection portion provided on the core insulating base material; a first dielectric layer laminated on the first main surface so as to embed the signal line and the first power supply line; a first ground layer provided on the first dielectric layer; a second dielectric layer laminated on the second main surface so as to embed the second power supply line; and a second ground layer provided on the second dielectric layer and sandwiching at least the signal line together with the first ground layer.

DETAILED DESCRIPTION

Figure 1:
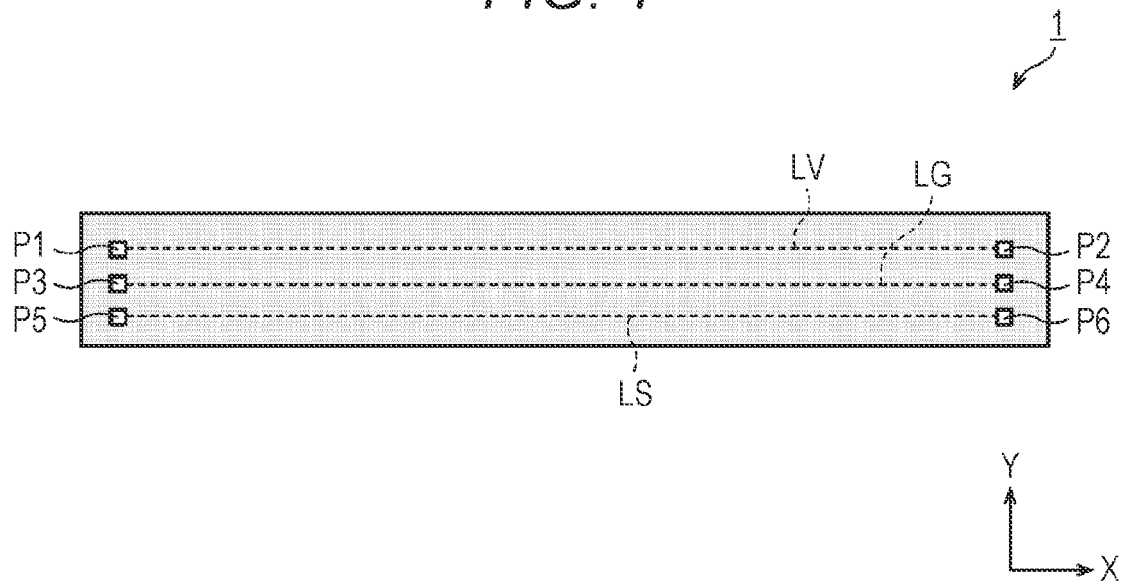
FIG. 1 is a schematic plan view of a wiring body according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As described above, it is required for a wiring body to increase a current capacity. However, it is difficult to increase a width of a power supply line due to restrictions on a width of the wiring body. Therefore, it is difficult to secure a required current capacity.

An object of the present disclosure is to provide a wiring body capable of increasing the current capacity of the power supply line while suppressing an increase in the width of the wiring body, and a method for manufacturing the wiring body.

A wiring body according to as aspect of the present disclosure (this wiring body) includes: a core insulating base material having a first main surface and a second main surface opposite to the first main surface; a signal line provided on the first main surface and extending in a longitudinal direction of the wiring body; a first power supply line provided on the first main surface and extending in the longitudinal direction of the wiring body; a second power supply line provided on the second main surface and extending in the longitudinal direction of the wiring body, and electrically connected to the first power supply line by an interlayer connection portion provided on the core insulating base material; a first dielectric layer laminated on the first main surface so as to embed the signal line and the first power supply line; a first ground layer provided on the first dielectric layer; a second dielectric layer laminated on the second main surface so as to embed the second power supply line; and a second ground layer provided on the second dielectric layer and sandwiching at least the signal line together with the first ground layer.

In the wiring body, the first power supply line may be thicker than the signal line.

In the wiring body, the first power supply line may include a metal foil provided on the first main surface and a plating layer formed on the metal foil, and the signal line may include a metal foil provided on the first main surface.

In the wiring body, the second power supply line may be thicker than the signal line.

In the wiring body, the first ground layer may substantially cover the first power supply line and the second power supply line when viewed from a normal direction of the first main surface of the core insulating base material.

In the wiring body, the second ground layer may substantially cover the first power supply line and the second power supply line when viewed from a normal direction of the second main surface of the core insulating base material.

The wiring body may further include a receiving land that is locally provided on an end of the signal line and the receiving land and a pad provided on the first dielectric layer may be electrically connected to each other by a filled via.

In the wiring body, the core insulating base material may contain a liquid crystal polymer.

In the wiring body, the first dielectric layer may include a first adhesive layer laminated on the first main surface so as to embed the signal line and the first power supply line, and a first insulating base material laminated on the first adhesive layer, and the second dielectric layer includes a second adhesive layer laminated on the second main surface so as to embed the second power supply line, and a second insulating base material laminated on the second adhesive layer.

In the wiring body, the first insulating base material and/or the second insulating base material may contain a liquid crystal polymer.

In the wiring body, a relative permittivity at 10 GHz of at least one of the core insulating base material, the first dielectric layer, and the second dielectric layer may be 2.0 to 3.5, and a dielectric loss tangent of the at least one may be 0.001 to 0.005.

The wiring body may further include: a first pad provided on the first dielectric layer and electrically connected to the signal line via a filled via; a second pad provided on the first dielectric layer and electrically connected to the first power supply line via a filled via; and a component having a first terminal soldered to the first pad and a second terminal soldered to the second pad.

A method for manufacturing a wiring body according to the present disclosure (this method for manufacturing a wiring body) includes: preparing a double-sided metal-clad laminate having a core insulating base material having a first main surface and a second main surface opposite to the first main surface, a first metal foil provided on the first main surface, and a second metal foil provided on the second main surface; forming a first conductive hole in the double-sided metal-clad laminate; forming a plating layer at least on the first and second metal foils in a portion to be a power supply line, and on an inner wall of the first conductive hole; obtaining a double-sided core circuit board by performing an etching process on the first metal foil, the second metal foil, and the plating layer to form a signal line and a power supply line; preparing a first single-sided metal-clad laminate having a first insulating base material having a third main surface and a fourth main surface opposite to the third main surface, and a third metal foil provided on the third main surface; laminating a first adhesive layer on the fourth main surface, and laminating a first protective film on the first adhesive layer; forming a bottomed second conductive hole in which the third metal foil is exposed on a bottom surface, by irradiating a predetermined portion of the first protective film with a laser beam to remove a portion of the first protective film, the first adhesive layer, and the first insulating base material, corresponding to the predetermined portion; obtaining a first single-sided circuit board by filling a first conductive paste in the second conductive hole; preparing a second single-sided metal-clad laminate having a second insulating base material having a fifth main surface and a sixth main surface opposite to the fifth main surface, and a fourth metal foil provided on the sixth main surface; laminating a second adhesive layer on the fifth main surface, and laminating a second protective film on the second adhesive layer; forming a bottomed third conductive hole in which the fourth metal foil is exposed on a bottom surface, by irradiating a predetermined portion of the second protective film with the laser beam to remove a portion of the second protective film, the second adhesive layer, and the second insulating base material, corresponding to the predetermined portion; obtaining a second single-sided circuit board by filling a second conductive paste in the third conductive hole; peeling the first protective film from the first adhesive layer of the first single-sided circuit board, and peeling the second protective film from the second adhesive layer of the second single-sided circuit board; aligning the first single-sided circuit board, the second single-sided circuit board, and the double-sided core circuit board by facing the first adhesive layer of the first single-sided circuit board to one main surface of the double-sided core circuit board and by facing the second adhesive layer of the second single-sided circuit board to the other main surface of the double-sided core circuit board, and then laminating the first single-sided circuit board, the second single-sided circuit board, and the double-sided core circuit board so as to sandwich the double-sided core circuit board between the first single-sided circuit board and the second single-sided circuit board, to form a laminated body; and integrating the laminated body by heating and pressurization.

In the method for manufacturing the wiring body, forming the plating layer may include avoiding forming a plating layer in a portion to be the signal line.

In the method for manufacturing the wiring body, obtaining the double-sided core circuit board may be performed by a roll-to-roll method.

According to an aspect of the present disclosure, it is possible to provide the wiring body capable of increasing the current capacity of the power supply line while suppressing the increase in the width of the wiring body, and the method for manufacturing the wiring body.

Hereinafter, embodiments according to the present disclosure will be described with reference to the drawings. In each figure, components having the same function are denoted by the same reference numerals. The drawings are schematically drawn.

In each figure, a relationship (an aspect ratio) between a thickness and a plane dimension, a ratio of thicknesses of the layers, and the like do not always match actual ones.

<Wiring Body 1>

Figure 2:
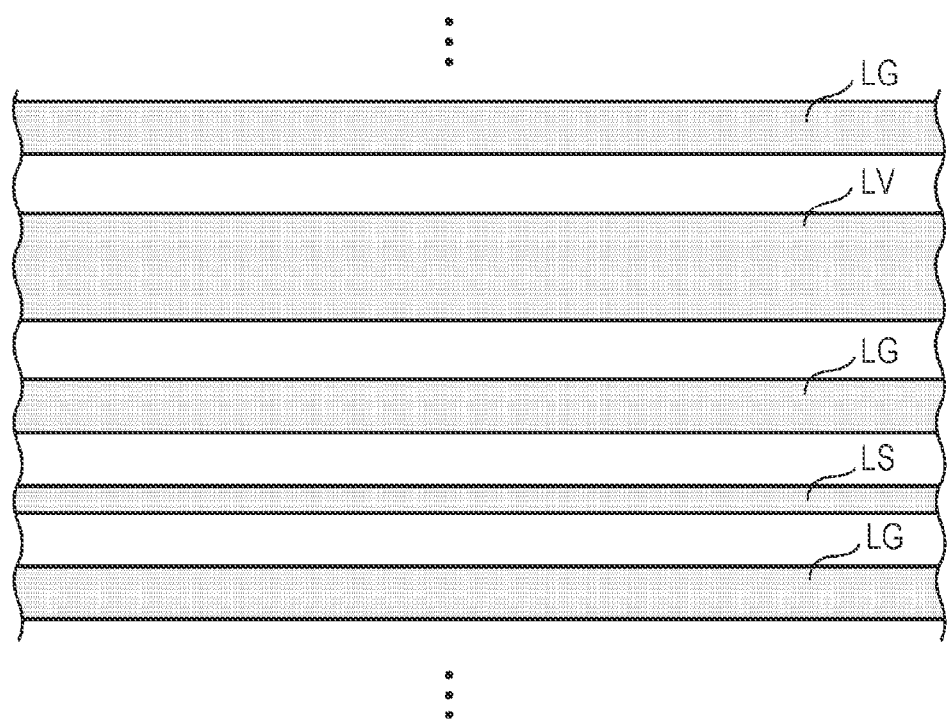
FIG. 2 is a plan view illustrating a part of a plurality of wirings provided inside the wiring body according to the embodiment.

First of all, a schematic configuration of a wiring body 1 according to the present embodiment will be described with reference to FIGS. 1 and 2. FIG. 1 is a schematic plan view of the wiring body 1, and FIG. 2 is a plan view illustrating a part of a plurality of wirings provided inside the wiring body 1. In FIG. 1, the X direction is the longitudinal direction of the wiring body 1, and the Y direction is a width direction of the wiring body 1.

The wiring body 1 is a wiring body for transmitting signals and electric power. The wiring body 1 is provided in a housing of an information processing terminal such as a smartphone or a tablet terminal. For example, the wiring body 1 is used to electrically connect an RF module that transmits and receives radio signals to a main circuit board on which a signal processing chip or the like is mounted.

As illustrated in FIG. 1, inside the wiring body 1, a power supply line LV, a signal line LS, and a ground wiring LG are provided to extend in the longitudinal direction of the wiring body 1.

The power supply line LV is a wiring for transmitting the electric power. As will be described in detail below, the power supply line LV is configured such that conductive layers respectively formed on an upper surface and a lower surface of a core base material (an insulating base material 11 to be described below) of the wiring body 1 are electrically connected to each other by the interlayer connection portion such as a through-hole. Thus, a substantial thickness of the power supply line can be increased even under a constraint on the width of the wiring body 1. As a result, the required current capacity can be secured.

The signal line LS is a wiring for transmitting a high-speed signal. As will be described in detail below, the signal line LS is formed thinner than the power supply line LV. Further, a line width of the signal line LS is controlled with high accuracy. Therefore, it is excellent in impedance matching.

The ground wiring LG is provided to stabilize a potential of the signal line LS. In the present embodiment, as illustrated in FIG. 2, ground wirings LG are provided on both sides of the signal line LS.

As illustrated in FIG. 1, a plurality of pads P1 to P6 is provided at both ends of the wiring body 1 for mounting components (not shown) such as connectors. The pad P1 and the pad P2 are electrically connected by the power supply line LV. The pad P3 and the pad P4 are electrically connected by the ground wiring LG. The pad P5 and the pad P6 are electrically connected by the signal line LS.

FIG. 1 schematically illustrates the wiring body 1 according to the present embodiment in a simplified manner. The number and arrangement of various wirings and pads are not limited to the number and arrangement illustrated in FIG. 1. For example, the wiring body 1 may be provided with a plurality of the signal lines LS. Further, the wiring body 1 may be provided with a plurality of the power supply lines LV. The pads may be provided as many as the number corresponding to the signal lines LS.

As illustrated in FIG. 2, the signal line LS may be disposed to be sandwiched between the ground wirings LG. Like the signal line LS, the power supply line LV may also be disposed to be sandwiched between the ground wirings LG.

The signal line LS is not limited to a single-ended transmission line, and may be provided as a differential line. In this case, two signal lines are provided to extend in parallel without sandwiching the ground wiring LG. Further, a plurality of pairs of differential lines may be provided with the ground wiring LG interposed therebetween. In addition, the single-ended transmission line and the differential line may be mixed and provided.

A planar shape of each wiring is not limited to a linear shape as illustrated in FIG. 2. The planar shape of each wiring may be, for example, a shape as described in JP-A-2019-106508.

Figure 3:
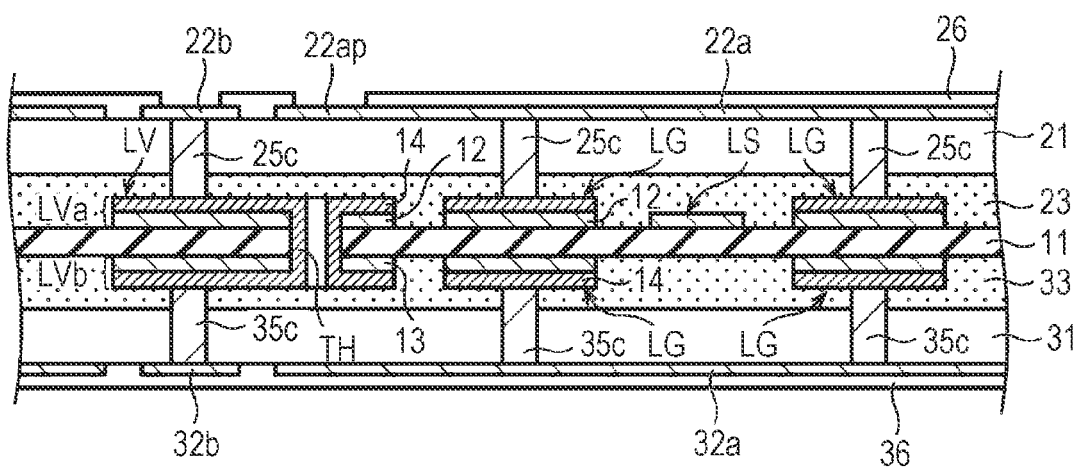
FIG. 3 is a partial cross-sectional view in a width direction at an end of the wiring body according to the embodiment.
Figure 4:
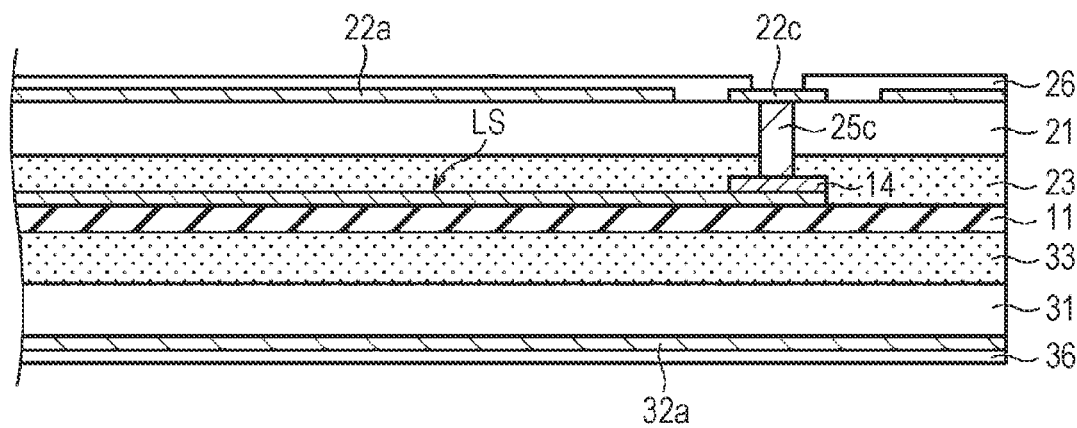
FIG. 4 is a partial cross-sectional view in a longitudinal direction along a signal line of the wiring body according to the embodiment.

Next, an internal structure of the wiring body 1 will be described in detail with reference to cross-sectional views of FIGS. 3 and 4. FIG. 3 is a partial cross-sectional view in the width direction at an end of the wiring body 1. FIG. 4 is a partial cross-sectional view of the wiring body 1 in the longitudinal direction along the signal line.

The wiring body 1 includes the insulating base material (core insulating base material) 11, the various wirings (signal line LS, power supply line LV, and ground wiring LG) provided on the insulating base material 11, an adhesive layer 23 (a first adhesive layer) formed on the upper surface of the insulating base material 11, an insulating base material 21 (a first insulating base material) laminated on the adhesive layer 23, a conductor portion (ground layer 22a, pads 22b and 22c) provided on the insulating base material 21, an adhesive layer 33 (a second adhesive layer) laminated on the lower surface of the insulating base material 11, an insulating base material 31 (a second insulating base material) laminated on the adhesive layer 33, a conductor portion (ground layer 32a, pad 32b) provided on the insulating base material 31, the interlayer connection portion (a through-hole TH, filled vias 25c and 35c), and solder resist layers 26 and 36. Hereinafter, each component will be described in detail.

The insulating base material 11 is the core base material of the wiring body 1, and includes, for example, a flexible insulating resin film. As a material of the insulating base material 11, it is desirable to use an insulating material having a small relative permittivity and a dielectric loss tangent (tan 5) from a viewpoint of reducing transmission loss of the high-speed signal. Examples of such a material include a liquid crystal polymer (LCP). Note that the material of the insulating base material 11 may be polyimide (PI), modified polyimide (MPI), polyethylene naphthalate (PEN), polyetheretherketone (PEEK), fluororesin (PFA, PTFE or the like) or the like.

A thickness of the insulating base material 11 may be determined according to transmission characteristics and/or flexibility required for the wiring body. For example, the thickness of the insulating base material 11 is 25 to 100 μm.

The power supply line LV has a power supply line LVa (the first power supply line) and a power supply line LVb (the second power supply line). The power supply line LVa is provided on the upper surface (first main surface) of the insulating base material 11 and is formed to extend in the longitudinal direction of the wiring body 1. The power supply line LVb is provided on the lower surface (second main surface opposite to the first main surface) of the insulating base material 11, and is formed to extend in the longitudinal direction of the wiring body 1. The power supply line LVa and the power supply line LVb are electrically connected to each other by the through-hole TH formed in the insulating base material 11.

As illustrated in FIG. 3, the power supply line LVa includes a two-layer conductor film (a metal foil 12 and a plating layer 14). Therefore, the power supply line LVa is thicker than the signal line LS including one-layer of the conductor film. Similarly, the power supply line LVb includes the two-layer conductor film (a metal foil 13 and the plating layer 14). Note that it is not essential that the power supply lines LVa and LVb include the two-layer conductor film. At least one of the power supply lines LVa and LVb may be configured to include the metal foil while not including the plating layer 14.

The power supply line LVa is electrically connected to a pad 22b (second pad) via the filled via 25c. Similarly, the power supply line LVb is electrically connected to the pad 32b via the filled via 35c. The pad 22b is solder-connected to a second terminal (not shown) of a component mounted on the wiring body 1. The pad 22b is provided on the insulating base material 21 (on the first dielectric layer) and is electrically connected to the power supply line LV via the filled via 25c. Note that in the present embodiment, since the pad 32b is not used, it is covered with a solder resist layer 36.

The power supply line LVa and the power supply line LVb are formed so that at least a part of them overlap each other when viewed from the normal direction of the main surface of the insulating base material 11. In the present embodiment, the power supply line LVa and the power supply line LVb are formed to completely overlap each other.

As described above, the signal line LS is formed on the upper surface of the insulating base material 11. As illustrated in FIG. 4, the signal line LS is electrically connected to the pad 22c (first pad) provided on the insulating base material 21 via the filled via 25c. The pad 22c is solder-connected to the first terminal (not shown) of the component mounted on the wiring body 1. The pad 22c is provided on the insulating base material 21 (on the first dielectric layer) and is electrically connected to the signal line LS via the filled via 25c.

As illustrated in FIG. 4, the plating layer 14 is locally provided as the receiving land between an end of the signal line LS and the filled via 25c. Thus, a length of the filled via 25c can be reduced by a thickness of the plating layer 14. As a result, reliability of interlayer connection can be improved. Provision of the receiving land is effective particularly when the insulating base material 21 contains a material (such as a liquid crystal polymer) having a large coefficient of thermal expansion.

As illustrated in FIG. 3, in the present embodiment, the ground wirings LG are respectively formed on the upper surface and the lower surface of the insulating base material 11. Each ground wiring LG includes the two-layer conductor film, like the power supply lines LVa and LVb. Therefore, the length of the filled via 25c can be reduced by the thickness of the plating layer 14. As a result, the reliability of the interlayer connection can be improved.

The ground wiring LG formed on the upper surface of the insulating base material 11 and the ground wiring LG formed on the lower surface of the insulating base material 11 may be electrically connected to each other by the interlayer connection portion such as the through-hole, like the power supply line LVa and the power supply line LVb. Note that the ground wiring LG on the lower surface of the insulating base material 11 may be omitted.

As illustrated in FIG. 3, the adhesive layer 23 is formed on the upper surface of the insulating base material 11 so as to embed the signal line LS, the power supply line LVa, and the ground wiring LG formed on the upper surface of the insulating base material 11.

The adhesive layer 33 is laminated on the lower surface of the insulating base material 11 so as to embed the power supply line LVb, and the ground wiring LG formed on the lower surface of the insulating base material 11.

As a material of the adhesive layers 23 and 33, a material having thermosetting property and capable of ensuring sufficient adhesive strength is used. As this material, for example, an adhesive containing polyolefin, polystyrene, polyimide or the like as a main component is used.

Further, as the material of the adhesive layers 23 and 33, an adhesive having a dielectric property equal to or higher than that of the insulating base material 11 may be used. This can improve the transmission characteristics of the wiring body 1.

As illustrated in FIG. 3, the insulating base material 21 is laminated on the adhesive layer 23. The insulating base material 21 constitutes a dielectric layer (the first dielectric layer) between each wiring and the ground layer together with the adhesive layer 23. The insulating base material 31 is laminated on the adhesive layer 33. The insulating base material 31 constitutes a dielectric layer (the second dielectric layer) between each wiring and the ground layer together with the adhesive layer 33.

As the material of the insulating base materials 21 and 31, it is desirable to use the insulating material having a small relative permittivity and a dielectric loss tangent from the viewpoint of reducing the transmission loss of the high-speed signal. Examples of such a material include liquid crystal polymer (LCP). Note that the material of the insulating base materials 21 and 31 may be polyimide (PI), modified polyimide (MPI), polyethylene naphthalate (PEN), polyetheretherketone (PEEK), fluororesin (PFA, PTFE or the like) or the like.

Thicknesses of the first and second dielectric layers are preferably thick from a viewpoint of transmission loss. On the other hand, the thicknesses of the first and second dielectric layers are preferably thin from a viewpoint of incorporation into devices and the reliability of the interlayer connection. In consideration of both of these viewpoints, regarding the thicknesses of the first and second dielectric layers, for example, thicknesses of the insulating base materials 21 and 31 containing the liquid crystal polymer are set in a range of 25 to 100 µm, and thicknesses of the adhesive layers 23 and 33 are set in a range of 25 to 75 µm. Here, the first and second dielectric layers have a structure in which LCP resin layers having a thickness of 50 µm are bonded with adhesives having a thickness of 50 µm.

The thicknesses of the insulating base materials 21 and 31 do not have to be the same. The insulating base material 31 may be thinner (for example, 25 µm thick) than the insulating base material 21 so that the signal line LS is disposed near a center of a cross-section of the wiring body 1.

The ground layer 22a (first ground layer) is provided on the insulating base material 21 (first dielectric layer). The ground layer 22a is electrically connected to the ground wiring LG on an upper side of the insulating base material 11 via the filled via 25c.

The ground layer 32a (second ground layer) is provided on the insulating base material 31 (second dielectric layer). The ground layer 32a is electrically connected to the ground wiring LG on a lower side of the insulating base material 11 via the filled via 35c.

As illustrated in FIG. 3, the ground layer 32a is provided to sandwich the signal line LS together with the ground layer 22a. Thus, a three-layer strip line structure is formed.

The ground layer 22a and/or the ground layer 32a may be configured to substantially cover the power supply line LVa and the power supply line LVb when viewed from the normal direction of the main surfaces (upper surface and lower surface) of the insulating base material 11. Here, "substantially covering the power supply line LVa and the power supply line LVb" means, for example, substantially covering the power supply line LVa and the power supply line LVb except for opening portions around the pads 22b and 32b. By arranging the power supply line LV inside the ground layer 22a in this way, noises radiated from the power supply line LV can be effectively shielded. As a result, electromagnetic noises leaking from the wiring body 1 can be reduced.

It is desirable that at least one layer of the insulating base materials 11, 21 and 31 and the adhesive layers 23 and 33 has a relative permittivity of 2.0 to 3.5 at 10 GHz and a dielectric loss tangent of 0.001 to 0.005, from a viewpoint of ensuring the transmission characteristics. These values are values measured by a method specified in JIS C 2138:2007.

In the wiring body 1 according to the present embodiment, the insulating base material 21 and the adhesive layer 23 constitute the first dielectric layer, and the insulating base material 31 and the adhesive layer 33 constitute the second dielectric layer. In this regard, configurations of the first and second dielectric layers are not limited to this. The first and second dielectric layers may be configured to include two or more insulating base materials and/or two or more adhesive layers. Wirings may be provided in the first and second dielectric layers. For example, the wirings (which function as the power supply lines) electrically connected to the filled via 25c may be provided in the first and second dielectric layers.

In the wiring body 1 according to the present embodiment, the signal line LS is provided on the upper surface of the insulating base material 11. In this regard, a signal line (not shown) may also be provided on the lower surface of the insulating base material 11. In this case, when the wiring body 1 is viewed in a plan view, the signal line is provided on the lower surface of the insulating base material 11 so as not to overlap the signal line LS on the upper surface of the insulating base material 11.

As described above, in the wiring body 1 according to the present embodiment, the power supply line LV includes two of the power supply line LVa and the power supply line LVb. Therefore, the substantial thickness of the power supply line can be increased even under the constraint on the width of the wiring body 1. As a result, the required current capacity can be secured. Further, the power supply lines LVa and LVb include the two-layer conductor film. Therefore, a larger current capacity can be secured.

Further, in the wiring body 1 according to the present embodiment, the power supply lines LVa and LVb include the two-layer conductor film, while the signal line LS includes a one-layer conductor film. Therefore, since the signal line LS is thinner than the power supply line LV, variation in the line width thereof is suppressed. Therefore, characteristic impedance matching can be easily achieved.

Further, in the wiring body 1 according to the present embodiment, the ground layers 22a and 32a are provided to substantially cover the power supply line LV when the wiring body 1 is viewed in a plan view. Therefore, the noises radiated from the power supply line LV can be effectively shielded.

As described above, in the wiring body according to the present embodiment, two power supply lines LVa and LVb are provided on a double-sided core circuit board 100 in order to secure the required current capacity with limited outer dimensions. In order to reduce radiation noises from the power supply line, the power supply line includes only the power supply lines LVa and LVb provided on the double-sided core circuit board 100 and substantially covered by the ground layers 22a and 32a.

<Method for Manufacturing the Wiring Body 1>

The method for manufacturing the wiring body 1 described above will be described with reference to process cross-sectional views of FIGS. 5A to 9.

First of all, a method for manufacturing the double-sided core circuit board will be described with reference to FIGS. 5A and 5B.

Figure 5A:
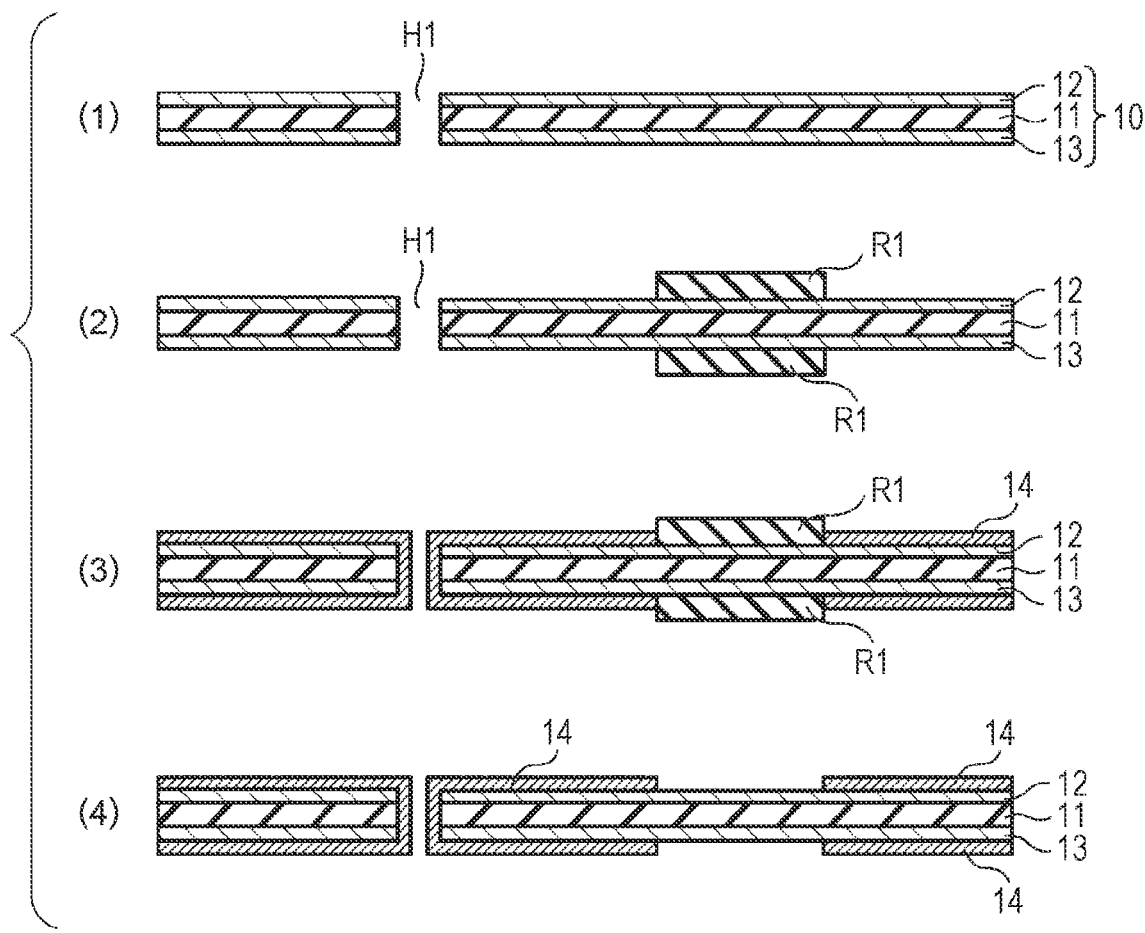
FIG. 5A is a process cross-sectional view for explaining a method for manufacturing a double-sided core circuit board according to the embodiment.

As illustrated in (1) of FIG. 5A, a double-sided metal-clad laminate 10 having the insulating base material 11, the metal foil 12 (first metal foil) provided on the upper surface of the insulating base material 11, and the metal foil 13 (second metal foil) provided on the lower surface of the insulating base material 11 is prepared. A conductive hole H1 (first conductive hole) is formed at a predetermined position of the double-sided metal-clad laminate 10.

The insulating base material 11 is, for example, a liquid crystal polymer film having a thickness of 25 μm. Note that the insulating base material 11 may include a plurality of laminated insulating layers. In this case, another wiring may be provided in the insulating base material 11.

The metal foils 12 and 13 are, for example, copper foils having a thickness of 18 μm. In this way, by using relatively thick metal foils as the metal foils 12 and 13, it is possible to easily secure the current capacity of the power supply line LV. The metal foils 12 and 13 may be foils of a metal (silver, aluminum or the like) other than copper.

In the present embodiment, the conductive hole H1 is formed as a through-hole that penetrates the double-sided metal-clad laminate 10 in a thickness direction thereof by laser processing or machining with an NC drill or the like. Note that the conductive hole H1 is not limited to the through-hole, and may be a bottomed conductive hole in which the metal foil 12 or the metal foil 13 is exposed on a bottom surface thereof.

Subsequently, as illustrated in (2) of FIG. 5A, a resist R1 for plating is formed in a predetermined position on the double-sided metal-clad laminate 10. The resist R1 is formed to cover in a later step a region where the signal line LS is formed, while not to cover in the later step a region where the power supply line LV is formed.

Subsequently, as illustrated in (3) of FIG. 5A, the double-sided metal-clad laminate 10 on which the resist R1 is formed is subjected to a conductive treatment and panel plating. In this step, for example, electrolytic copper plating is performed. Thus, the plating layer 14 is formed on portions of the metal foils 12 and 13, the portions being not coated with the resist R1. Further, the plating layer 14 is also formed on an inner wall of the conductive hole H1. Thus, the metal foil 12 and the metal foil 13 are electrically connected to each other. The thickness of the plating layer 14 is, for example, 15 μm.

Subsequently, as illustrated in (4) of FIG. 5A, the resist R1 is removed. The plating layer 14 is not formed in the region where the signal line LS is formed, and the plating layer 14 is formed in the region where the power supply lines LVa and LVb and the ground wiring LG are formed. That is, the plating layer 14 is formed at least on the metal foils 12 and 13 and on the inner wall of the conductive hole H1 in portions to be the power supply lines LVa and LVb. Then, in formation of the plating layer 14, it is avoided to form the plating layer 14 in a portion to be the signal line LS.

Subsequently, the metal foils 12 and 13 and the plating layer 14 are etched to form the signal line LS and the power supply lines LVa and LVb, so that the double-sided core circuit board 100 is obtained. That is, first of all, as illustrated in (1) of FIG. 5B, resists R2 for etching are formed at predetermined positions of the double-sided metal-clad laminate 10. The resists R2 are formed to cover portions where the power supply lines LVa and LVb, the signal line LS, and the ground wiring LG are formed.

Subsequently, as illustrated in (2) of FIG. 5B, portions of the metal foils 12 and 13 and the plating layer 14, that are not coated with the resist R2, are removed by etching. During etching process, the portion to be the signal line LS does not have the plating layer 14 formed, and includes only the metal foil 12. Therefore, since influence of side etching can be suppressed, the signal line can be formed with high dimensional processing accuracy.

On the other hand, the power supply line LV and the ground wiring LG, which do not require high accuracy in the line width, are formed by etching portions (portions having a two-layer structure) where the plating layer 14 is formed on the metal foils 12 and 13. Since lengths of the filled vias 25c and 35c can be reduced by the thickness of the plating layer 14 formed as the receiving land, the reliability of the interlayer connection can be improved. Further, in the power supply line LV, the current capacity can be increased while suppressing the line width.

Figure 5B:
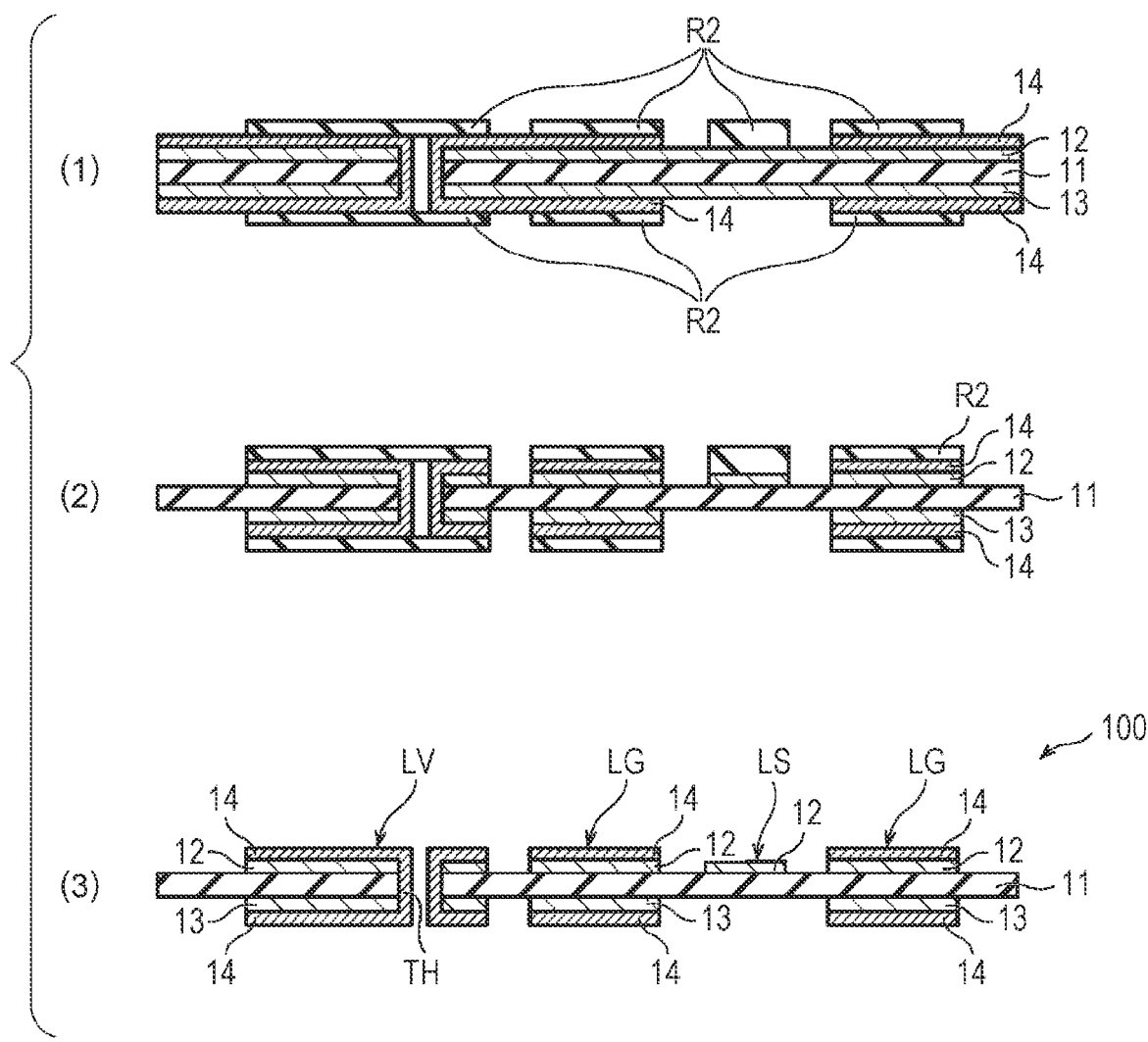
FIG. 5B is a process cross-sectional view for explaining the method for manufacturing the double-sided core circuit board according to the embodiment, following FIG. 5A.

Thereafter, as illustrated in (3) of FIG. 5B, the resists R2 are removed. By the steps up to this point, the double-sided core circuit board 100 can be obtained. The power supply line LV having the through-hole TH, the signal line LS, and the ground wiring LG are formed on the double-sided core circuit board 100.

A process for manufacturing the double-sided core circuit board 100 can be performed by a so-called roll-to-roll method. In this case, the double-sided core circuit board 100 can be manufactured with high productivity.

In the above method, the through-hole TH is formed as the interlayer connection portion. In this regard, the filled via may be formed as the interlayer connection portion. The filled via is formed, for example, by filling the bottomed conductive hole with a conductive paste.

Next, a method for manufacturing a single-sided circuit board (upper side) will be described with reference to FIGS. 6A and 6B.

Figure 6A:
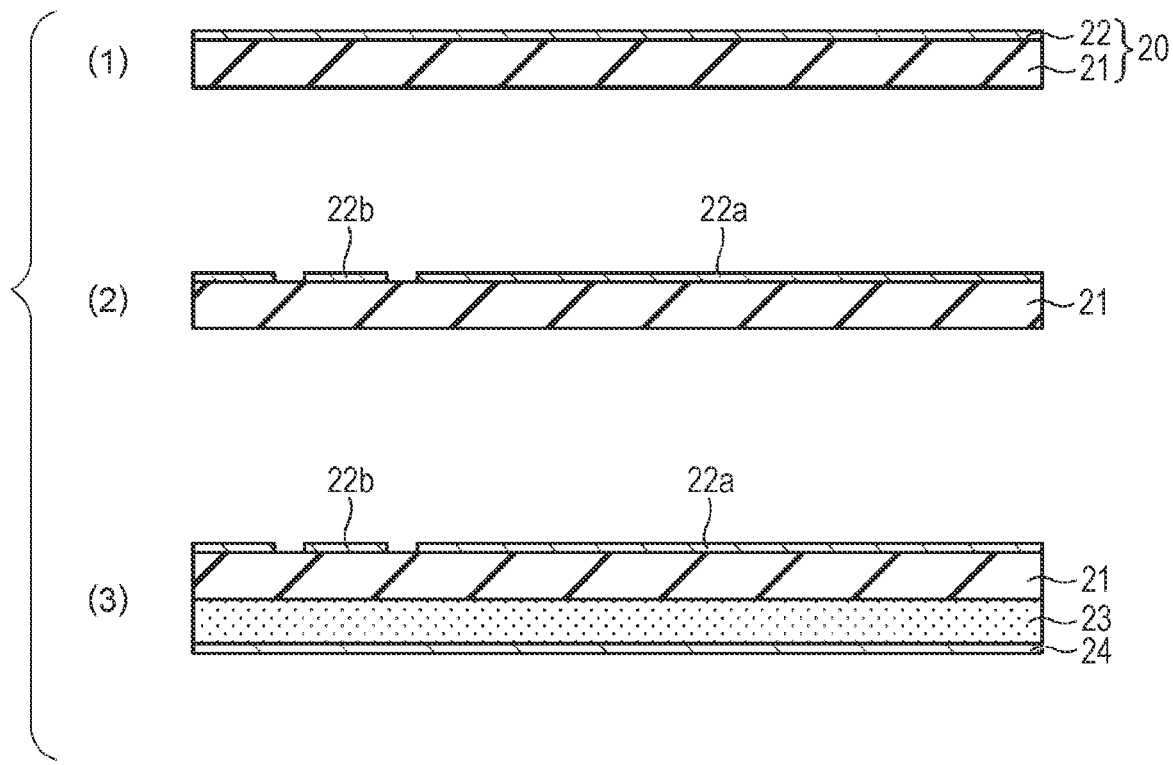
FIG. 6A is a process cross-sectional view for explaining a method for manufacturing a single-sided circuit board for upper build-up according to the embodiment.

As illustrated in (1) of FIG. 6A, a single-sided metal-clad laminate 20 (first single-sided metal-clad laminate) having the insulating base material 21 and a metal foil 22 (third metal foil) provided on the upper surface of the insulating base material 21 is prepared. The insulating base material 21 has an upper surface (a third main surface) and a lower surface (fourth main surface opposite to the third main surface). The insulating base material 21 is, for example, a liquid crystal polymer film having a thickness of 25 μm. The metal foil 22 is, for example, a copper foil having a thickness of 12 μm. Note that the metal foil 22 may be a foil of the metal (silver, aluminum or the like) other than copper.

Subsequently, as illustrated in (2) of FIG. 6A, the metal foil 22 of the single-sided metal-clad laminate 20 is patterned by a known fabrication method. Thus, the ground layer 22a and the pad 22b are formed. Note that, although not shown, the above-mentioned pad 22c for the signal line is also formed in this step.

Subsequently, as illustrated in (3) of FIG. 6A, the adhesive layer 23 is formed (laminated) on the lower surface of the insulating base material 21. Further, a protective film 24 (first protective film) is formed (laminated) on the adhesive layer 23. A thickness of the adhesive layer 23 is, for example, 50 μm. A thickness of the protective film 24 is, for example, 15 μm.

As the material of the adhesive layer 23, a material capable of ensuring the adhesive strength with the insulating base material 21 such as a liquid crystal polymer film is used. As the material of the adhesive layer 23, an adhesive having a dielectric property equal to or lower than that of the insulating base material 21 may be used.

As the protective film 24, for example, a film containing polyethylene terephthalate (PET) is used.

The thickness of the protective film 24 defines an amount of protrusion of a conductive paste 25 to be described below. If the protective film 24 is too thick, the amount of protrusion of the conductive paste 25 is too large, and the adhesive layer 23 may not be able to completely absorb unevenness in a lamination step described below. On the other hand, if the protective film 24 is too thin, the amount of protrusion of the conductive paste 25 is too small, connection reliability may not be sufficiently ensured between the conductive paste 25 and the wiring of the double-sided core circuit board 100. In consideration of these points, the thickness of the protective film 24 may be, for example, within a range of 15 t 10 μm.

A protective film (not shown) with an adhesive layer may be used, which includes the protective film 24 and the adhesive layer 23 applied to one side of the protective film 24. In this case, a state illustrated in (3) of FIG. 6A can be obtained by bonding the protective film with the adhesive layer to the insulating base material 21 side of the single-sided metal-clad laminate 20.

Subsequently, as illustrated in (1) of FIG. 6B, by irradiating predetermined portions of the protective film 24 with the laser beam, portions of the protective film 24, the adhesive layer 23, and the insulating base material 21 correspond to the predetermined portions are removed to form a bottomed conductive hole H2 (second conductive hole) in which the metal foils (ground layer 22a, pads 22b and 22c) are exposed on a bottom surface thereof. A diameter of the conductive hole H2 is, for example, φ150 μm to 200 μm. When a carbon dioxide laser is used, the laser processing is performed with a beam diameter as the above diameter.

In this step, first of all, the conductive hole H2 is perforated by irradiating a laser pulse. For the laser processing, for example, a carbon dioxide laser processing machine (ML605GTXIII-5100U2) manufactured by Mitsubishi Electric Corporation is used. The beam diameter of the laser pulse is set to 150 μm by a predetermined aperture or the like. Further, a pulse width of the laser pulse is set to 10 μsec, and energy per pulse is set to 5 mJ. The conductive holes H2 are perforated by irradiating the pulse of 5 shots per location. After perforation, desmear treatment is performed, to remove resin residue at a boundary between the insulating base material 21 and the metal foil, and a back surface treatment film (Ni/Cr film or the like) of the metal foil.

Subsequently, as illustrated in (2) of FIG. 6B, the conductive holes H2 are filled with the conductive paste 25 (first conductive paste). More specifically, the conductive paste 25 is filled in the conductive holes H2 using the protective film 24 as a printing mask by a printing method such as screen printing. Here, the conductive paste 25 is obtained by dispersing metal particles in a resin binder which is a paste-like thermosetting resin.

In this step, it is preferable to print the conductive paste 25 in a vacuum environment in order to suppress mixing of air voids in the conductive holes H2. For example, it is preferable to use a vacuum printing machine for screen printing. Thus, even if the void is generated in the conductive hole H2 during printing of the conductive paste, the void is crushed and disappears by the atmospheric pressure when a vacuum state is released.

Figure 6B:
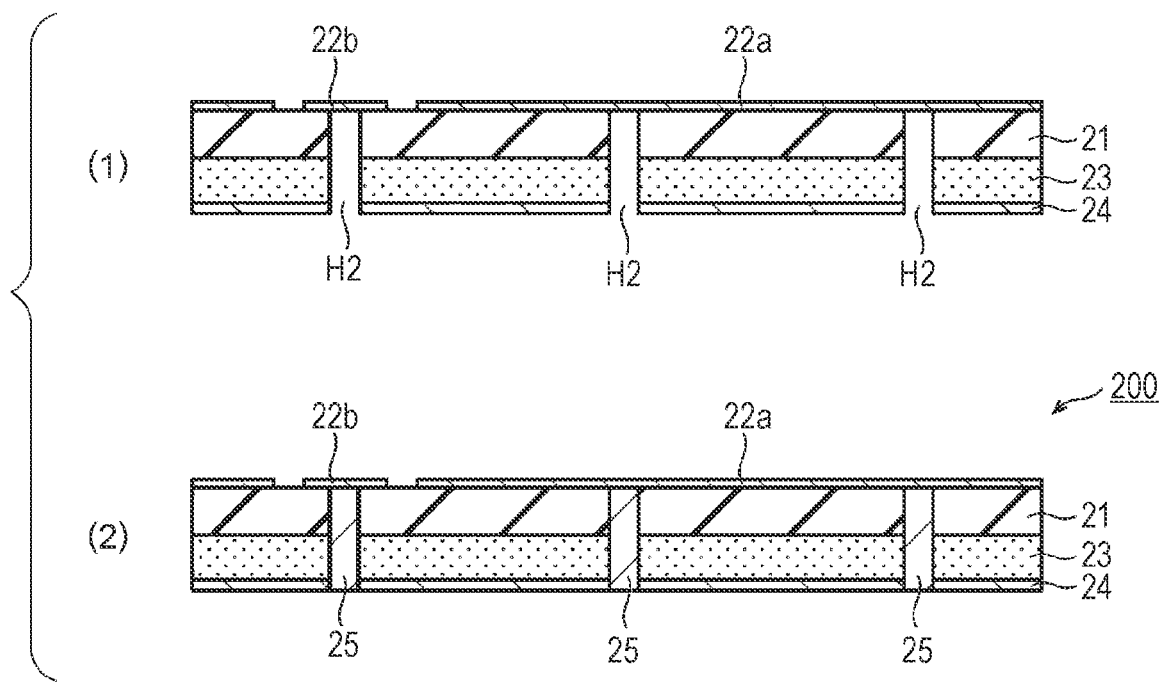
FIG. 6B is a process cross-sectional view for explaining the method for manufacturing the single-sided circuit board for upper build-up according to the embodiment, following FIG. 6A.

Through the above steps, a single-sided circuit board 200 (first single-sided circuit board) illustrated in (2) of FIG. 6B is obtained.

Next, a method for manufacturing a single-sided circuit board (lower side) will be described with reference to FIGS. 7A and 7B.

Figure 7A:
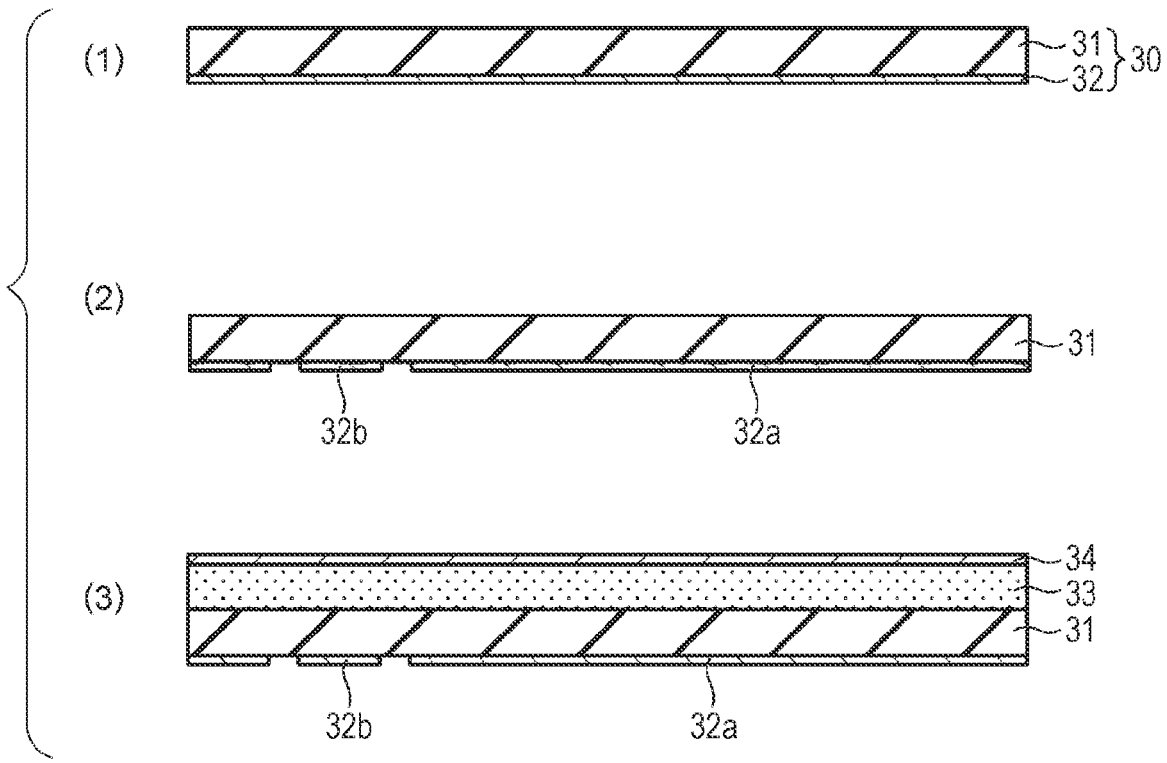
FIG. 7A is a process cross-sectional view for explaining a method for manufacturing a single-sided circuit board for lower build-up according to the embodiment.

As illustrated in (1) of FIG. 7A, a single-sided metal-clad laminate 30 (second single-sided metal-clad laminate) having the insulating base material 31 and a metal foil 32 (fourth metal foil) provided on the lower surface of the insulating base material 31 is prepared. The insulating base material 31 has an upper surface (a fifth main surface) and a lower surface (sixth main surface opposite to the fifth main surface). The material and thickness of the insulating base material 31 are the same as those of the above-mentioned insulating base material 21. Further, the material and thickness of the metal foil 32 are the same as those of the metal foil 22 described above.

Subsequently, as illustrated in (2) of FIG. 7A, the metal foil 32 of the single-sided metal-clad laminate 30 is patterned by the known fabrication method. Thus, the ground layer 32a and the pad 32b are formed.

Subsequently, as illustrated in (3) of FIG. 7A, the adhesive layer 33 is formed (laminated) on the upper surface of the insulating base material 31. Further, a protective film 34 (second protective film) is formed (laminated) on the adhesive layer 33. A protective film with an adhesive layer (not shown) may be used, which includes the protective film 34 and the adhesive layer 33 applied to one side of the protective film 34. In this case, a state illustrated in (3) of FIG. 7A can be obtained by bonding the protective film with the adhesive layer to the insulating base material 31 side of the single-sided metal-clad laminate 30.

A thickness of the adhesive layer 33 is, for example, 50 µm. A thickness of the protective film 34 is, for example, 15 µm. The material and thickness of the adhesive layer 33 are the same as those of the adhesive layer 23 described above. Further, the material and thickness of the protective film 34 are the same as those of the protective film 24 described above.

Subsequently, as illustrated in (1) of FIG. 7B, by irradiating predetermined portions of the protective film 34 with the laser beam, portions of the protective film 34, the adhesive layer 33, and the insulating base material 31 correspond to the predetermined portions are removed to form a bottomed conductive hole H3 (third conductive hole) in which the metal foils (ground layer 32a, pad 32b) are exposed on a bottom surface thereof. A diameter of the conductive hole H3 is, for example, φ150 µm to 200 µm. Details of this step are the same as in the above-mentioned case of forming the conductive hole H2.

Subsequently, as illustrated in (2) of FIG. 7B, the conductive hole H3 is filled with the conductive paste 35 (second conductive paste). Details of this step are the same as in the above-mentioned case of filling the conductive paste 25.

Figure 7B:
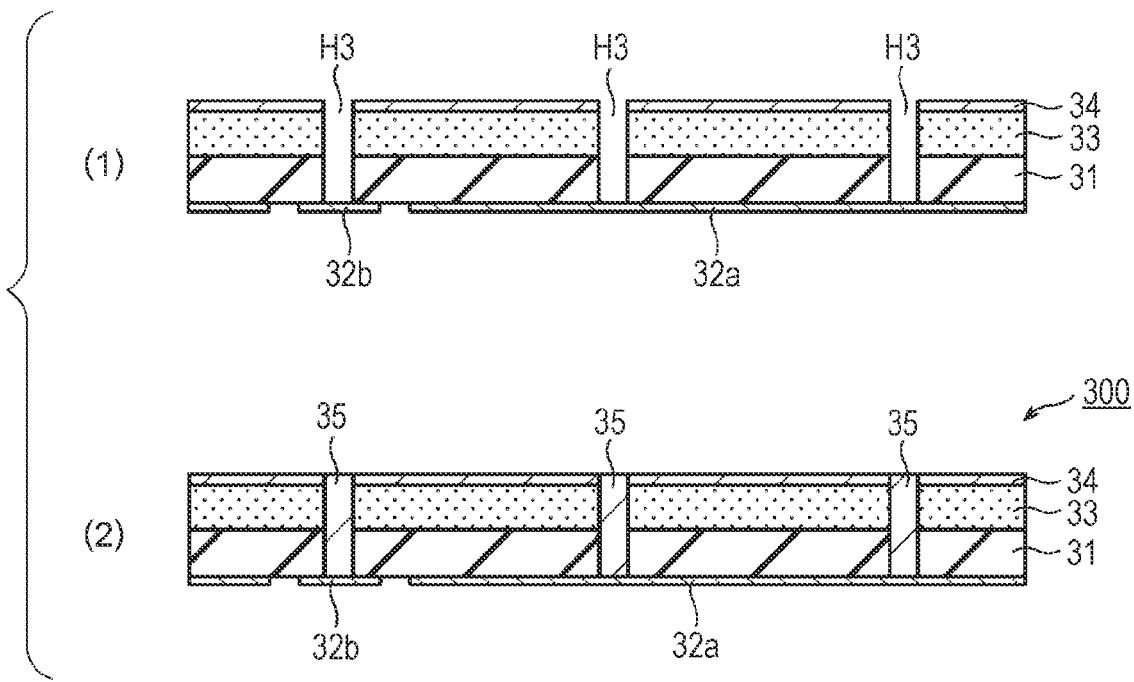
FIG. 7B is a process cross-sectional view for explaining the method for manufacturing the single-sided circuit board for lower build-up according to the embodiment, following FIG. 7A.

Through the above steps, a single-sided circuit board 300 (second single-sided circuit board) illustrated in (2) of FIG. 7B is obtained.

Subsequently, the single-sided circuit board 200 and the single-sided circuit board 300 are respectively aligned and laminated on the upper and lower sides of the double-sided core circuit board 100, and these circuit boards are integrated by heating and pressurization. A detailed process is as follows.

Figure 8:
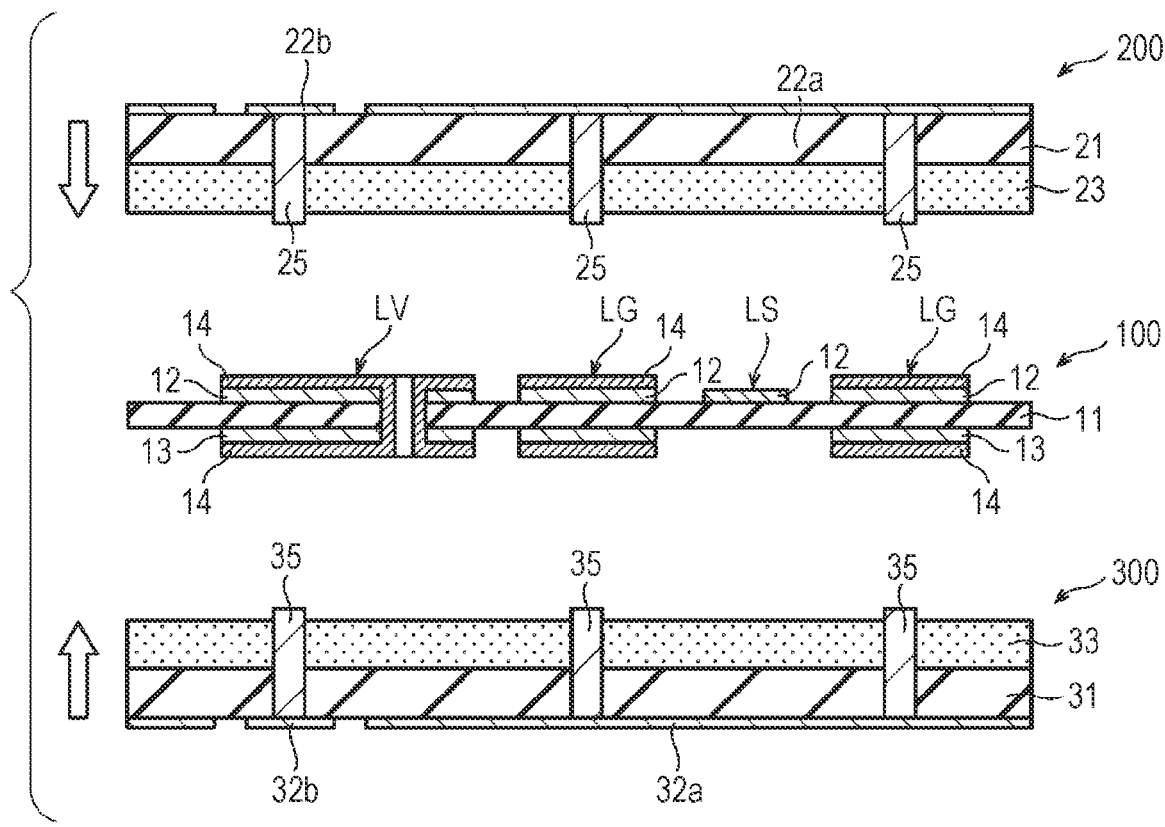
FIG. 8 is a process cross-sectional view for explaining a lamination step of the wiring body according to the embodiment.

First of all, as illustrated in FIG. 8, the protective film 24 is peeled off from the adhesive layer 23 of the single-sided circuit board 200. Thus, the conductive paste 25 filled in the conductive hole H2 protrudes from the adhesive layer 23 by an amount corresponding to the thickness of the protective film 24. Similarly, the protective film 34 is peeled off from the adhesive layer 33 of the single-sided circuit board 300. Thus, the conductive paste 35 filled in the conductive hole H3 protrudes from the adhesive layer 33 by an amount corresponding to the thickness of the protective film 34.

Subsequently, as illustrated in FIG. 8, the adhesive layer 23 of the single-sided circuit board 200 is opposed to the upper surface (one main surface) of the double-sided core circuit board 100, and the adhesive layer 33 of the single-sided circuit board 30) is opposed to the lower surface (the other main surface) of the double-sided core circuit board, so that the double-sided core circuit board 100, the single-sided circuit board 200, and the single-sided circuit board 300 are aligned with each other.

Specifically, the single-sided circuit board 200 is aligned with the double-sided core circuit board 100 so that the conductive pastes 25 protruding from the adhesive layer 23 respectively contact the power supply line LV, the signal line LS, and the ground wiring LG. Further, the single-sided circuit board 300 is aligned with the double-sided core circuit board 100 so that the conductive pastes 35 protruding from the adhesive layer 33 respectively contact the power supply line LV and the ground wiring LG.

After the circuit boards are aligned as described above, the laminated body is formed by laminating the double-sided core circuit board 100, the single-sided circuit board 200, and the single-sided circuit board 300. That is, the laminated body is formed by laminating the double-sided core circuit board 100, the single-sided circuit board 200, and the single-sided circuit board 300 so as to sandwich the double-sided core circuit board 100 between the single-sided circuit board 200 and the single-sided circuit board 300.

Thereafter, using a vacuum press device or a vacuum laminator device, the laminated body is integrated by heating and pressurization (integration step). In this step, metal bonding of the conductive pastes 25 and 35 and curing of the adhesive layers 23 and 33 proceed at the same time.

In the integration step, for example, the laminated body is heated to about 200° C. and pressurized at a pressure of about several MPa. When the insulating base materials 11, 21 and 31 are made of a liquid crystal polymer, heating temperature is preferably set to a temperature sufficiently lower (for example, by 50° C. or more) than a softening temperature of the liquid crystal polymer.

When the vacuum press device is used, for example, the laminated body is held for about 30 to 60 minutes under the above heating and pressurizing conditions. Thus, heat curing of the adhesive layers 23 and 33 and heat curing of binder resins of the conductive pastes 25 and 35 are completed.

When using the vacuum laminator device, heating and pressurizing time is about several minutes. At an end of heating and pressurization, thermosetting reaction is not yet complete. Therefore, the laminated body is transferred from the vacuum laminator device to an oven device, and the laminated body is subjected to post-cure treatment. In the post-cure treatment, the laminated body is heated, for example, at a temperature of about 200° C. for about 60 minutes. Thus, the heat curing of the adhesive layers 23 and 33 and the heat curing of the binder resins of the conductive pastes 25 and 35 are completed.

Figure 9:
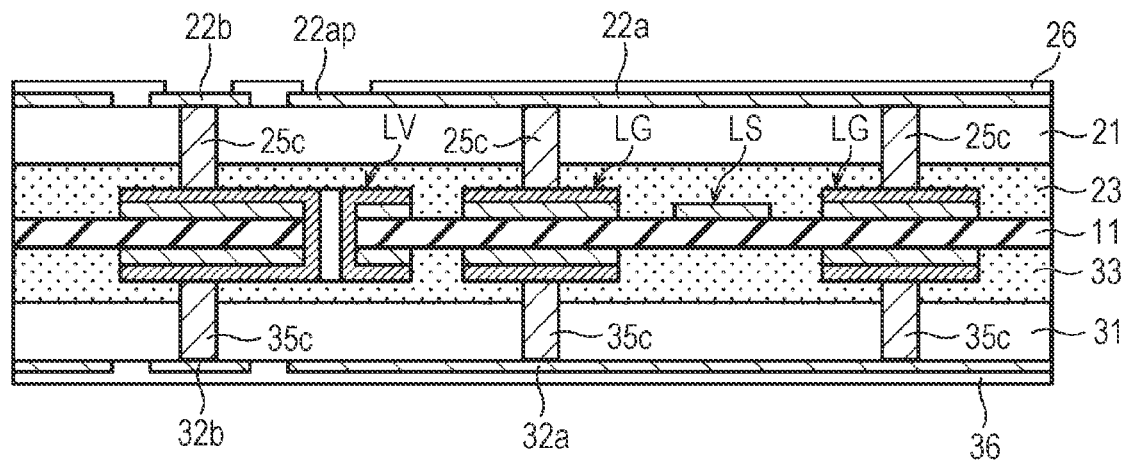
FIG. 9 is a partial cross-sectional view of the wiring body according to the embodiment, (1) is the partial cross-sectional view of the wiring body in which a solder resist layer is formed, and (2) is the partial cross-sectional view of the wiring body on which a connector component is mounted.
Figure 9:
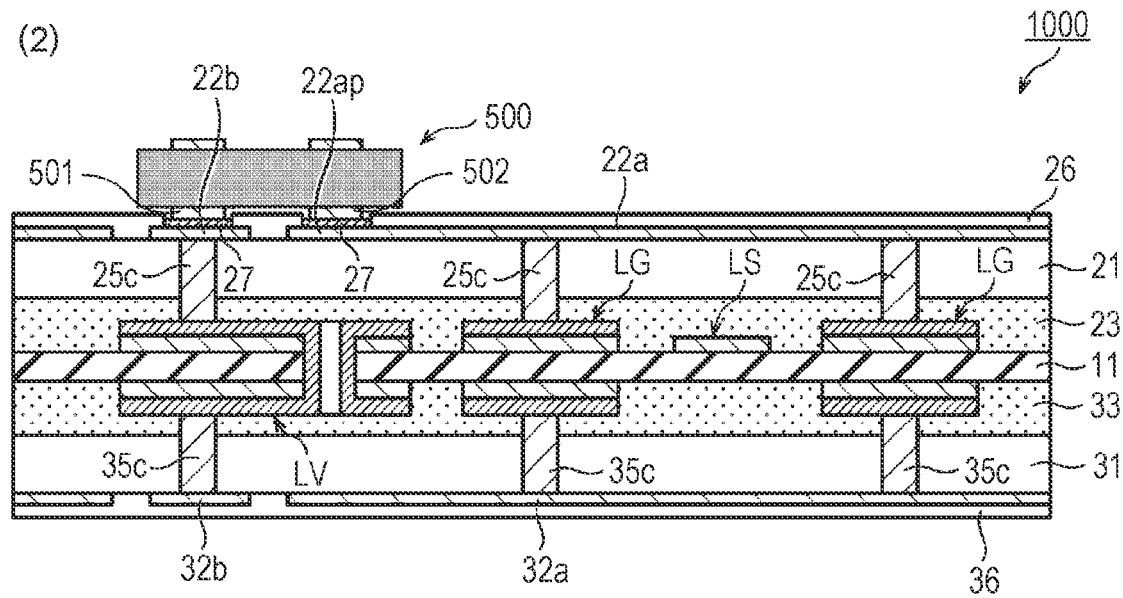

Regardless of whether the vacuum press device or the vacuum laminator device is used, the metal particles contained in the conductive pastes 25 and 35 are metal-bonded to each other and metal-bonded to the plating layer 14 by heating at a predetermined temperature. Thus, as illustrated in FIG. 9, the filled vias 25c and 35c for interlayer connection are formed. Further, by this heating, both the thermosetting reaction of the resin binder contained in the conductive pastes 25 and 35 and the thermosetting reaction of the adhesive layers 23 and 33 are substantially completed.

In the integration step, in order for the metal particles contained in the conductive pastes 25 and 35 to be metal-bonded by heating at a lamination process temperature (for example, about 200° C.), melting point of the metal particles is preferably equal to or lower than the lamination process temperature. Examples of such low melting point metals include In, SnIn, and SnBi. Therefore, as the conductive pastes 25 and 35, it is preferable to use conductive pastes containing metal particles made of any of these low melting point metals.

When the metal foils 22 and 32 are copper foils and the plating layer 14 is a copper plating layer, as the conductive pastes 25 and 35, it is preferable to use conductive pastes containing metal particles made of Sn, Zn, Al, Ag, Ni, Cu, or alloys thereof. Thus, by heating at the lamination process temperature (for example, about 200° C.), the metal particles contained in the conductive pastes 25 and 35 form an alloy layer with copper and are metal-bonded.

After the integration step, surface treatment of the conductive layer exposed to an outside is performed. Thereafter, as illustrated in (1) of FIG. 9, the solder resist layers 26 and 36 are formed as a surface protective film. The solder resist layer 26 is provided with an opening so that the pads 22ap, 22b, and 22c are exposed. Note that when the pad 32b is used, an opening is provided in the solder resist layer 36 so that the pad 32b is exposed.

Thereafter, as illustrated in (2) of FIG. 9, a connector component 500 is mounted on the wiring body 1. The connector component 500 has terminals 501 and 502. Note that the connector component 500 may have a terminal (not shown) electrically connected to the pad 22c for the signal line LS.

The terminal 501 is electrically connected to the pad 22b for the power supply line LV via the solder 27. The terminal 502 is electrically connected to the pad 22ap for the ground wiring LG via the solder 27. The pad 22ap is a part of the ground layer 22a and is exposed from the opening of the solder resist layer 26. The pad 22ap is provided on the insulating base material 21 and is electrically connected to the ground wiring LG via the filled via 25c.

Through the above steps, a wiring body 1000 with a connector is obtained.

Patterning of the metal foils 22 and 32 (formation of the ground layers 22a and 32a, and the pads 22b, 22c and 32b) may be performed after the integration step.

In the above manufacturing method, various wirings are formed by forming the plating layer on a portion to be the power supply line, or the like, and then performing the etching process. In this regard, on the contrary, various wirings may be formed by performing the etching process first, and then the plating layer may be formed by partial plating only on a necessary portion such as a portion to be the power supply line.

The filled vias 25c and 35c are formed as the interlayer connection portions. However, the interlayer connection portion is not limited to the filled via. When the insulating base materials 21 and 31 contain a material having a relatively small coefficient of thermal expansion such as polyimide, the through-hole may be formed as the interlayer connection portion.

The filled via 35c connected to the power supply line LV may be omitted when the pad 32b is not used.

The component mounted on the wiring body 1 is not limited to the connector component, and may be another component (chip or the like).

<Modification of Double-Sided Core Circuit Board>

Finally, a modification of the double-sided core circuit board will be described with reference to process cross-sectional views of FIGS. 10A and 10B. In this modification, the plating layer is also formed on the signal line LS.

Figure 10A:
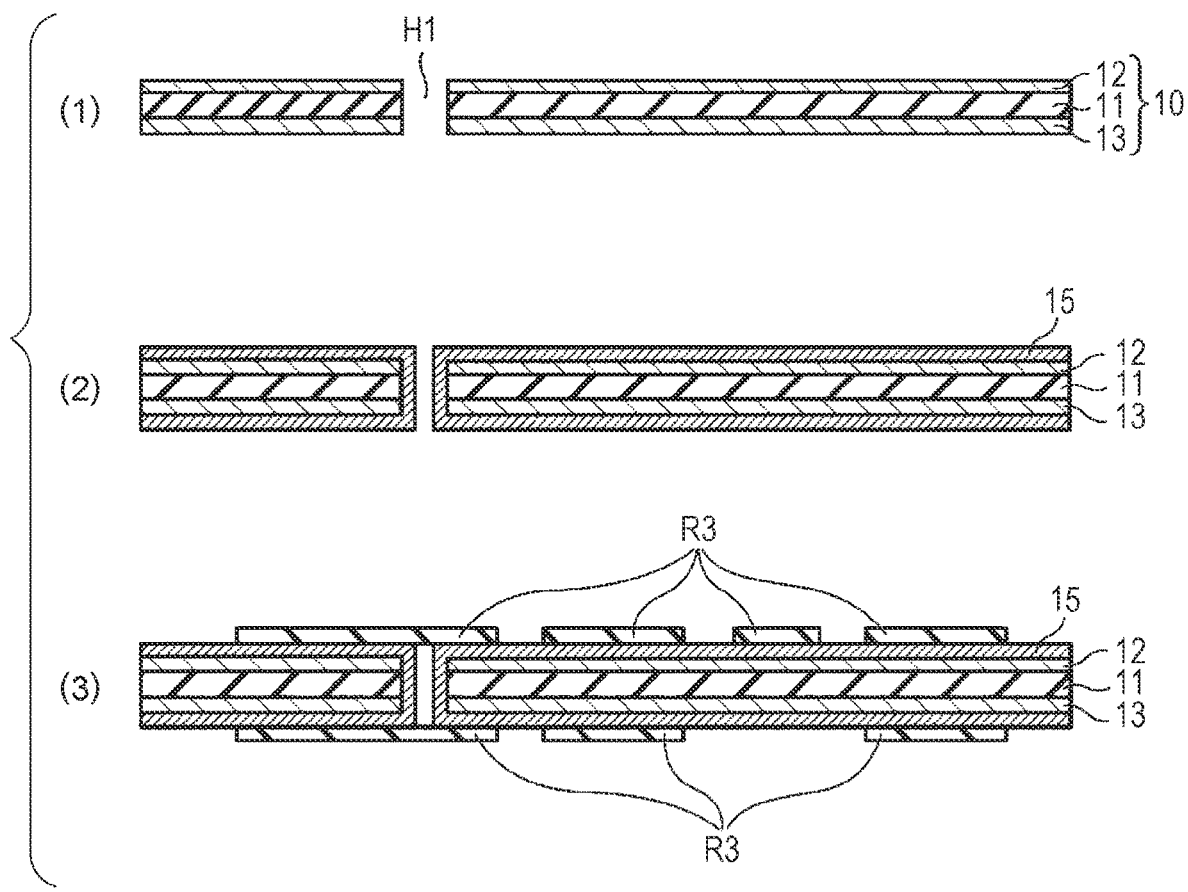
FIG. 10A is a process cross-sectional view for explaining the method for manufacturing the double-sided core circuit board according to a modification of the embodiment.
Figure 10B:
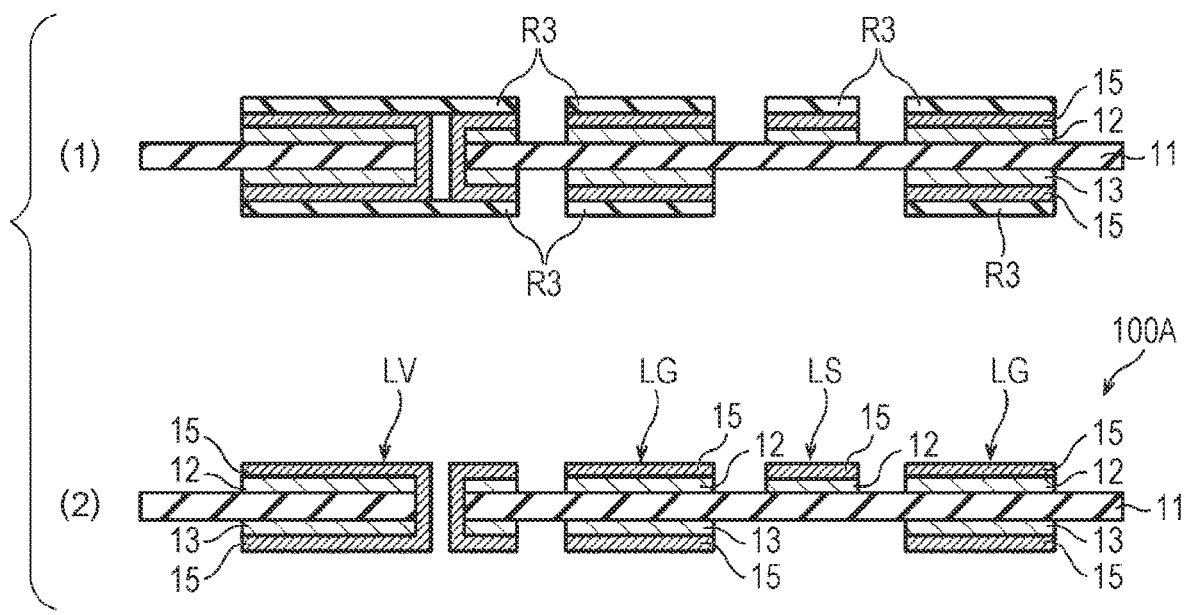
FIG. 10B is a process cross-sectional view for explaining the method for manufacturing the double-sided core circuit board according to the modification, following FIG. 10A.

As illustrated in (1) of FIG. 10A, the double-sided metal-clad laminate 10 is prepared, and the conductive hole H1 is formed at a predetermined position of the double-sided metal-clad laminate 10.

Subsequently, as illustrated in (2) of FIG. 10A, the double-sided metal-clad laminate 10 is plated (panel plating). This step is performed, for example, by electrolytic copper plating. Thus, the plating layer 15 is formed on the metal foils 12 and 13 and on the inner wall of the conductive hole H1.

Subsequently, as illustrated in (3) of FIG. 10A, resists R3 for etching are formed at predetermined positions of the double-sided metal-clad laminate 10. The resists R3 are formed to cover portions where the power supply lines LVa and LVb, the signal line LS, and the ground wiring LG are formed.

Subsequently, as illustrated in (1) of FIG. 10B, portions of the metal foils 12 and 13 and the plating layer 15, that are not coated with the resist R3, are removed by etching. Thereafter, as illustrated in (2) of FIG. 10B, the resists R3 are removed. By the steps up to this point, a double-sided core circuit board 100A according to this modification can be obtained. The power supply line LV having the through-hole TH, the signal line LS, and the ground wiring LG are formed on the double-sided core circuit board 100A. A thickness of the signal line LS is the same as that of the power supply line LV.

When a request for the line width of the signal line LS is relatively low, the double-sided core circuit board may be manufactured by the method according to this modification. In this modification, production efficiency can be improved as the number of steps is small.

Based on the above description, one of ordinary skill in the art may be able to conceive additional effects and various modifications with respect to techniques of the present disclosure. However, aspects of the present disclosure are not limited to the embodiments described above. Various additions, changes and partial deletions can be made without departing from the conceptual idea and spirit of the techniques of the present disclosure derived from the claims and their equivalents.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A wiring body comprising:
   a core insulating base material having a first main surface and a second main surface opposite to the first main surface;
   a signal line provided on the first main surface and extending in a longitudinal direction of the wiring body;
   a first power supply line provided on the first main surface and extending in the longitudinal direction of the wiring body;
   a second power supply line provided on the second main surface and extending in the longitudinal direction of the wiring body, and electrically connected to the first power supply line by an interlayer connection portion provided on the core insulating base material;
   a first dielectric layer laminated on the first main surface so as to embed the signal line and the first power supply line;
   a first ground layer provided on the first dielectric layer;
   a second dielectric layer laminated on the second main surface so as to embed the second power supply line;
   a second ground layer provided on the second dielectric layer and sandwiching at least the signal line together with the first ground layer;
   a first pad provided on the first dielectric layer and electrically connected to the first power supply line via a first filled via; and
   a second pad provided on the second dielectric layer and electrically connected to the second power supply line via a second filled via.

2. The wiring body according to claim 1, wherein the first power supply line is thicker than the signal line.

3. The wiring body according to claim 2, wherein
   the first power supply line includes a metal foil provided on the first main surface and a plating layer formed on the metal foil, and
   the signal line includes a metal foil provided on the first main surface.

4. The wiring body according to claim 2, wherein the second power supply line is thicker than the signal line.

5. The wiring body according to claim 1, wherein the first ground layer substantially covers the first power supply line and the second power supply line when viewed from a normal direction of the first main surface of the core insulating base material.

6. The wiring body according to claim 5, wherein the second ground layer substantially covers the first power supply line and the second power supply line when viewed from a normal direction of the second main surface of the core insulating base material.

7. The wiring body according to claim 1, further comprising a receiving land that is locally provided on an end of the signal line, wherein
   the receiving land and a pad provided on the first dielectric layer are electrically connected to each other by a filled via.

8. The wiring body according to claim 1, wherein the core insulating base material contains a liquid crystal polymer.

9. The wiring body according to claim 1, wherein
   the first dielectric layer includes a first adhesive layer laminated on the first main surface so as to embed the signal line and the first power supply line, and a first insulating base material laminated on the first adhesive layer, and
   the second dielectric layer includes a second adhesive layer laminated on the second main surface so as to embed the second power supply line, and a second insulating base material laminated on the second adhesive layer.

10. The wiring body according to claim 9, wherein the first insulating base material and/or the second insulating base material contains a liquid crystal polymer.

11. The wiring body according to claim 1, wherein a relative permittivity at 10 GHz of at least one of the core insulating base material, the first dielectric layer, and the second dielectric layer is 2.0 to 3.5, and a dielectric loss tangent of the at least one is 0.001 to 0.005.

12. The wiring body according to claim 1, further comprising:
    a third pad provided on the first dielectric layer and electrically connected to the signal line via a third filled via;
    and
    a component having a first terminal soldered to the first pad and a second terminal soldered to the third pad.

13. A method for manufacturing the wiring body according to claim 1, comprising: preparing a double-sided metal-clad laminate having the core insulating base material having the first main surface and the second main surface opposite to the first main surface, a first metal foil provided on the first main surface, and a second metal foil provided on the second main surface; forming a first conductive hole in the double-sided metal-clad laminate; forming a plating layer at least on the first and second metal foils in a portion to be a power supply line, and on an inner wall of the first conductive hole; obtaining a double-sided core circuit board by performing an etching process on the first metal foil, the second metal foil, and the plating layer to form the signal line, the first power supply line and the second power supply line; preparing a first single-sided metal-clad laminate having a first insulating base material having a third main surface and a fourth main surface opposite to the third main surface, and a third metal foil provided on the third main surface; forming the first pad by performing an etching process on the third metal foil; laminating a first adhesive layer on the fourth main surface, and laminating a first protective film on the first adhesive layer; forming a bottomed second conductive hole in which the first pad is exposed on a bottom surface, by irradiating a predetermined portion of the first protective film with a laser beam to remove a portion of the first protective film, the first adhesive layer, and the first insulating base material, corresponding to the predetermined portion; obtaining a first single-sided circuit board by filling a first conductive paste in the second conductive hole; preparing a second single-sided metal-clad laminate having a second insulating base material having a fifth main surface and a sixth main surface opposite to the fifth main surface, and a fourth metal foil provided on the sixth main surface; forming the second pad by performing an etching process on the fourth metal foil; laminating a second adhesive layer on the fifth main surface, and laminating a second protective film on the second adhesive layer; forming a bottomed third conductive hole in which the second pad is exposed on a bottom surface, by irradiating a predetermined portion of the second protective film with the laser beam to remove a portion of the second protective film, the second adhesive layer, and the second insulating base material, corresponding to the predetermined portion; obtaining a second single-sided circuit board by filling a second conductive paste in the third conductive hole; peeling the first protective film from the first adhesive layer of the first single-sided circuit board, and peeling the second protective film from the second adhesive layer of the second single-sided circuit board; aligning the first single-sided circuit board, the second single-sided circuit board, and the double-sided core circuit board by facing the first adhesive layer of the first single-sided circuit board to one main surface of the double-sided core circuit board and by facing the second adhesive layer of the second single-sided circuit board to the other main surface of the double-sided core circuit board, and then laminating the first single-sided circuit board, the second single-sided circuit board, and the double-sided core circuit board so as to sandwich the double-sided core circuit board between the first single-sided circuit board and the second single-sided circuit board, to form a laminated body; and integrating the laminated body by heating and pressurization, wherein, in the integrating, forming the first filled via by metallically bonding the first conductive paste and the first power supply line, and forming the second filled via by metallically bonding the second conductive paste and the second power supply line.

14. The method for manufacturing the wiring body according to claim 13, wherein forming the plating layer includes avoiding forming a plating layer in a portion to be the signal line.

15. The method for manufacturing the wiring body according to claim 13, wherein obtaining the double-sided core circuit board is performed by a roll-to-roll method.

* * * * *